United States Patent
Maeda et al.

(10) Patent No.: US 8,450,622 B2
(45) Date of Patent: May 28, 2013

(54) MULTILAYER WIRING SUBSTRATE AND METHOD OF MANUFACTURING THE SAME

(75) Inventors: Shinnosuke Maeda, Nagoya (JP); Takuya Torii, Komaki (JP); Tetsuo Suzuki, Niwa-gun (JP); Satoshi Hirano, Chita-gun (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 334 days.

(21) Appl. No.: 13/031,735

(22) Filed: Feb. 22, 2011

(65) Prior Publication Data
US 2011/0211320 A1    Sep. 1, 2011

(30) Foreign Application Priority Data
Feb. 26, 2010   (JP) ................ 2010-041469

(51) Int. Cl.
  *H01K 3/10*   (2006.01)
  *H05K 3/02*   (2006.01)
  *H05K 3/10*   (2006.01)
  *H05K 1/11*   (2006.01)

(52) U.S. Cl.
  USPC ............... 174/261; 29/852; 29/846

(58) Field of Classification Search
  USPC ...... 174/260–266; 361/792–795; 29/846–853
  See application file for complete search history.

(56) References Cited

U.S. PATENT DOCUMENTS
2009/0126981 A1    5/2009   Horiuchi et al.

FOREIGN PATENT DOCUMENTS
JP   2009-117703   5/2009

*Primary Examiner* — Jeremy Norris
(74) *Attorney, Agent, or Firm* — Stites & Harbison PLLC; Jeffrey A. Haeberlin

(57) ABSTRACT

A multilayer wiring substrate includes first principal surface side connection terminals arranged on a first principal surface of a stacked configuration; wherein, the first principal surface side connection terminals include an IC chip connection terminal, and a passive element connection terminal; the IC chip connection terminal is located in an opening formed in a resin insulating layer of an uppermost outer layer; the passive element connection terminal is formed of an upper terminal part formed on the resin insulating layer, and a lower terminal part located in an opening formed at a portion of an inner side of the upper terminal part in the resin insulating layer; and, wherein an upper face of the upper terminal part is higher than a reference surface, and an upper face of the IC chip connection terminal and the lower terminal part are identical in height to or lower in height than the reference surface.

12 Claims, 13 Drawing Sheets

MULTILAYER WIRING SUBSTRATE AND METHOD OF MANUFACTURING THE SAME

CROSS REFERENCE TO RELATED APPLICATION

The present application claims priority from Japanese Patent Application No. 2010-041469, which was filed on Feb. 26, 2010, the disclosure of which is herein incorporated by reference in its entirety.

TECHNICAL FIELD

The present invention relates to a multilayer wiring substrate having a multilayer stacked configuration that is multilayered by alternately stacking a plurality of resin insulating layers having a same resin insulating material as a main element and a plurality of conductor layers, and having no so-called core substrate whose both surfaces are formed thereon with buildup layers in sequence, and to a method of manufacturing the same.

BACKGROUND

In recent years, semiconductor integrated devices (IC chips) used as microprocessors of computers or the like have been enhanced in speed and function more and more, and, thus, IC chips tend to have an increased number of terminals and a reduced inter-terminal pitch. In general, a large number of terminals are densely disposed in an array on the bottom face of an IC chip. Such a group of terminals are flip-chip connected to a group of terminals on the motherboard. However, since the inter-terminal pitch differs greatly between the IC chip side terminal group and the mother board side terminal group, difficulty is encountered in connecting the IC chip directly onto the motherboard. Therefore, in general, a semiconductor package including an IC chip mounted on an IC chip mounting wiring substrate is manufactured, and is then mounted on the motherboard.

A multilayer wiring substrate, in which buildup layers are formed on both of a surface and a reverse surface of a core substrate, is commercialized as an IC chip mounting wiring substrate forming such a kind of package. The multilayer wiring substrate employs, as a core substrate for instance, a resin substrate (glass epoxy substrate, etc.) formed with a resin-impregnated reinforcing fiber. And, the buildup layers are formed by stacking alternately resin insulating layers and conductor layers on a surface and a reverse surface of the core substrate having stiffness property. That is, in the multilayer wiring substrate, the core substrate serves to take a reinforcing role and is formed very thick as compared with the buildup layer. In addition, the core substrate is formed with wiring (in detail, through hole conductor, etc.) penetrated therein for electrically connecting the buildup layers formed on a surface and a reverse surface of the core substrate.

In recent years, signal frequencies used have been transferred to a high frequency band with high speed in a semiconductor device. In this case, the wiring penetrating the core substrate serves as a great inductor, causes transmission losses in high frequency signals or failures in circuit operations, and prevents the high speed. To solve such problems, a multilayer wiring substrate having no core substrate is disclosed (e.g., see Patent Document 1). Since the multilayer wiring substrate has no relatively thick core substrate to reduce the whole length of wiring, the transmission loss of the high frequency signal is reduced, thereby it is possible to operate a semiconductor integrated circuit device at a high speed.

RELATED TECHNICAL DOCUMENTS

Patent Documents

[Patent Document 1] JP-A 2009-117703

SUMMARY

In Patent Document 1, it is suggested a multilayer wiring substrate in which connection terminals of passive elements such as chip capacitor, etc. other than a connection terminal of an IC chip are formed on a mounting surface of an IC chip. That is, the mounting surface of an IC chip in the multilayer wiring substrate is formed thereon with a plurality kind of connection terminals each having different connection targets. And, a surface of the plurality kind of connection terminals is formed at a position having the same height as that of a surface of a resin insulating layer which is at the uppermost outer layer of mounting surface side of an IC chip. Like this, if each of the connection terminals is formed at the same height as the surface of the resin insulating layer of the uppermost outer layer, difficulty may be encountered in connecting the plurality kind of elements. In more detail, in a case where a connection terminal of an IC chip is formed thereon with a solder bump by using a solder ball, it is difficult to arrange the solder ball on the terminal if the surface of the connection terminal of the IC chip is at the same height as the surface of the resin insulating layer. In addition, in a case where the chip capacitor is connected to a connection terminal of a passive element by using solder, it may lack the solidity of connection because solder pellets may be formed on only the upper surface of terminal.

The invention has been made considering the above problems. An object of the invention is to provide a multilayer wiring substrate for accurately connecting an IC chip and a passive element.

According to a first illustrative aspect of the present invention, there is provided a multilayer wiring substrate, comprising: a stacked configuration that is multilayered by alternately stacking a plurality of resin insulating layers formed with a same material as a main element and a plurality of conductor layers; a plurality of first principal surface side connection terminals that are arranged on a first principal surface of the stacked configuration; and, a plurality of a second principal surface side connection terminals that are arranged on a second principal surface of the stacked configuration, wherein the plurality of conductor layers are arranged in the plurality of resin insulating layers and connected by a via conductor which expands in diameter as either the first principal surface or the second principal surface is approached, wherein, the plurality of first principal surface side connection terminals include an IC chip connection terminal, which has an IC chip as a connection target, and a passive element connection terminal, which has a passive element as a connection target and is greater in area than the IC chip connection terminal; the IC chip connection terminal is located in an opening formed in a resin insulating layer of an uppermost outer layer that is exposed at the first principal surface of the stacked configuration; the passive element connection terminal is formed of an upper terminal part formed on the resin insulating layer of the uppermost outer layer, and a lower terminal part located in an opening formed at a portion of an inner side of the upper terminal part in the resin insulating layer of the uppermost outer layer; wherein a surface of the resin insulating layer of the uppermost outer layer defines a reference surface; and wherein an upper face of the upper terminal part is higher than the reference surface, and an upper face of the IC chip connection terminal and the lower terminal part are identical in height to or lower in height than the reference surface.

According to the first illustrative aspect of the invention, it is provided a multilayer wiring substrate, as a coreless wiring substrate having no core substrate, in which a plurality of resin insulating layers composed of a same resin insulating material as a main element and a plurality of conductor layers are alternately stacked. In the multilayer wiring substrate, a first principal surface is provided thereon with two kinds of connection terminals, that is, a connection terminal of an IC chip and a connection terminal of a passive element that is wider in area than the connection terminal of the IC chip. The connection terminal of the passive element is formed of an upper terminal and a lower terminal, the upper terminal is formed on the resin insulating layer of the uppermost outer layer, and the lower terminal is arranged at a position corresponding to openings formed at a plurality of portions of the resin insulating layer of the uppermost outer layer. In addition, the connection terminal of the IC chip is arranged at a position corresponding each of the openings formed in the resin insulating layer of the uppermost outer layer. In this case, the upper surface of connection terminal of an IC chip and the lower part of connection terminal of a passive element are arranged to be identical in height to or lower in height than the surface (reference surface) of a resin insulating layer of the uppermost outer layer. Advantageously, the resin insulating layer of uppermost outer layer functions as a solder resist, such that
solder for connecting an IC chip or a passive element may accurately be provided on each of the connection terminals. In addition, in the connection terminal of the passive element, a plurality of openings are formed at an inner side of the upper terminal part, and each of the openings is filled with solder, thereby the upper terminal part of and the lower terminal part may definitely electrically be connected. In this case, the upper terminal part and the lower terminal part of the connection terminal of the passive element are three-dimensionally connected by soldering, and the passive element may be connected to a connection terminal of the passive element with sufficient solidity. In addition, the upper terminal part forming the connection terminal of the passive element is arranged at a position that is higher than the reference surface. That is, the upper surface of connection terminal (upper terminal part) of the passive element for connecting the passive element is arranged at a higher position than the upper surface of the connection terminal of the IC chip. When the connection terminal of the IC chip and the connection terminal of the passive element are formed in such a manner, the IC chip and the passive element may accurately be connected to each of the connection terminals that are arranged at positions having different heights.

In accordance with one implementation, the upper terminal part includes a copper layer formed on the resin insulating layer of the uppermost outer layer and a coating metal layer made of metal other than copper of the copper layer. It is preferable that the copper layer be thinner than the coating metal layer. In such a manner, the height (protruding amount) of the upper terminal part relative to a reference surface of the resin insulating layer of the uppermost outer layer may be lowered, and solder print on the upper terminal part may easily be performed. At this time, if the upper terminal part is formed high, solder adhered to the terminal side surface may be expanded in a horizontal direction because the area of the terminal side surface becomes greater. In this case, the connection terminals of the passive elements need to be arranged at some intervals between the terminals. In contrast, if the upper terminal part is formed low, it is possible to arrange the connection terminals of the passive element at a reduced inter-terminal pitch because solder is prevented from being expanded in a horizontal direction.

It is preferable that the total thickness of the coating metal layer and the copper layer forming the upper terminal part be less than or equal to 15 μm. In this way, the height of the upper terminal part relative to the reference surface of the resin insulating layer of the uppermost outer layer may definitely be lowered.

It is preferable that the copper layer of the upper terminal part be an electroless copper plating layer or a copper film, and the coating metal layer be made of at least two layers including an electroless nickel plating layer and an electroless gold plating layer that are formed on the electroless copper plating layer or the copper layer. In the coating metal layer, a palladium layer may be arranged between the electroless nickel plating layer and the electroless gold plating layer. If the copper layer and the coating metal layer are formed by electroless plating, the upper terminal part may be formed thin. Particularly, if the copper layer is formed by electroless copper plating, the copper layer may be formed thinner than in a case where the copper layer is formed by electro copper plating. As a result, the height of the upper terminal part may be lowered relative to the reference surface of the resin insulating layer of the uppermost outer layer.

It is desirable that the upper terminal part have a configuration in which an upper surface (face) and a lateral surface (face) of the copper layer terminal part be covered with the coating metal layer. In such a manner, the upper surface and lateral surface of the copper layer of the upper terminal part may definitely be formed with solder, thereby the passive element may be connected with sufficient rigidity.

The opening (or, in practice, the plurality of openings), which is (are) formed at a portion (plurality of portions) corresponding to the inner side (internal regions) of the upper terminal part (parts) in the uppermost outer layer of resin insulating layers, may expose a resin material at the inner side surface, and may be coated with a copper layer or a coating metal layer to thereby cover the inner side surface. Herein, in the case where the inner side surface of the opening is covered with the copper layer or the coating metal layer, the upper terminal part and the lower terminal part of the connection terminal of the passive element may electrically be connected by the copper layer or the coating metal layer. In addition, in the case where the resin material at the inner side surface of the openings is exposed, the connection terminal of the passive element may easily be formed because there is no need to provide the copper layer or the coating metal layer on the inner side surface.

Via conductors that are formed in the plurality of resin insulting layers may have a shape that becomes more and more expanded in diameter along the direction of a second principal surface side to a first principal surface side. In such a manner, the coreless wiring substrate having no core substrate may accurately be fabricated.

It is desirable that the plurality of resin insulating layers be formed with a resin insulating material having no photocurable property, for instance, a cured product of thermosetting resin insulating material. In this case, the resin insulating layer of the uppermost outer layer, in which various connection terminals are formed, is formed with a resin insulating material having the same excellent insulating property as the resin insulating layer in the inner side, thereby the intervals between the connection terminals may be reduced, and accordingly the multilayer wiring substrate may be integrated at a high density.

An appropriate high polymer material to form a plurality of resin insulating layers may include, for instance, thermosetting resins such as epoxy resin, phenol resin, urethane resin, silicon resin, polyimide resin, etc. and thermoplastic resins such as polycarbonate resin, acryl resin, polyacetal resin, polypropylene, etc. In addition, the appropriate high polymer material may include composite materials of the above resins and the organic fibers such as glass fiber (glass woven fabric or glass nonwoven fabric) or polyamide fiber, etc., or may include resin composites, for instance, a resin composite formed in such a manner that 3-dimensional mesh type of fluorinated resin based material such as continuously porous PTFE is impregnated with thermosetting resin such as epoxy resin, etc. In the meanwhile, regarding "a plurality of resin insulating layers having a same resin insulating material as a main element", for instance, if a same thermosetting resin is used as a main material in all the plurality of resin insulating layers, such a case may be included to a detailed embodiment of the invention even though there are differences in additives such as organic fibers impregnated into thermosetting resin.

According to a second illustrative aspect of the present invention, there is provided a method of manufacturing a multilayer wiring substrate having: a stacked configuration multilayered by alternately stacking a plurality of resin insulating layers formed with a same material as a main element and a plurality of conductor layers; a plurality of first principal surface side connection terminals arranged on a first principal surface of the stacked configuration; a plurality of a second principal surface side connection terminals arranged on a second principal surface of the stacked configuration; and the plurality of conductor layers arranged in the plurality of resin insulating layers, and connected by a via conductor that becomes expanded in diameter along a direction of facing the first principal surface or the second principal surface; the method comprising: a base preparing process that prepares a base on which stacking metal foils are stacked in a peelable state; a buildup process that alternately stacks the plurality of conductor layers and the plurality of resin insulating layers on the stacking metal foils to thereby form the stacked configuration and in which a coating metal foil is coated on a most outer surface of an uppermost outer layer therof; an opening forming process that forms, after the buildup process, an opening in a resin insulating layer of the uppermost outer layer, thereby exposing a conductor layer corresponding to a lower terminal part of the first principal surface side connection terminal; a terminal forming process that partly etches, after the buildup process, the coating metal foil to thereby form an upper terminal part of the first principal surface side connection terminal; and, a base removing process that removes the base after the opening forming process and the terminal forming process.

According to the second illustrative aspect of the invention, a stacked configuration is formed by alternately stacking a plurality of resin insulating layers and a plurality of conductor layers by a buildup process. Thereafter, in an opening forming process, openings are formed in the resin insulating layer of the uppermost outer layer, thereby the conductor layer of the lower terminal part in the opening are exposed. And, during the terminal forming process, a metal foil as a buildup material provided at the uppermost outer layer may partly be etched to form a pattern of the upper terminal part. In this way, the first principal surface side connection terminal, which is formed of an upper terminal part and a lower terminal part, may accurately be formed. And, in the first principal surface side connection terminal, the openings are filled with solder, thereby the upper terminal part and the lower terminal part may be electrically connected. In this case, the upper terminal part and the lower terminal part of the first principal side connection terminal may be 3-dimensionally connected through the solder, thereby the rigidity of soldering connection at the first principal surface side connection terminal may be sufficiently secured.

In the buildup process, it is desirable that the plurality of resin insulating layers be made of a cured product of resin insulating material having no photocurable property. In this way, the resin insulating layer of uppermost outer layer in which various connection terminals are formed, is formed with a resin insulating material having the same excellent insulating property as the resin insulating layer in the inner side, thereby the intervals between the connection terminals may be reduced, and accordingly the multilayer wiring substrate may be integrated at a high density.

In the opening forming process, it is desirable that a metal foil on the metal foil containing buildup material and a resin insulating layer of the uppermost outer layer be opened by performing a laser drilling process. In this way, the opening may accurately be formed at an inner side portion of the upper terminal part.

In accordance with one implementation, the metal foil on the metal foil containing buildup material is partly etched to thereby form the upper terminal part of the first principal surface side connection terminal, and thereafter the opening is formed by performing the opening forming process. In this way, the upper terminal part having a through hole at a portion corresponding to the opening may be formed during the terminal forming process. And, in the opening forming process, the opening may easily be formed by processing only the resin insulating layer without processing the metal foil.

According to a third illustrative aspect of the present invention, there is provided a method of manufacturing a multilayer wiring substrate having: a stacked configuration multilayered by alternately stacking a plurality of resin insulating layers formed with a same material as a main element and a plurality of conductor layers; a plurality of first face side connection terminals arranged on a first principal surface of the stacked configuration; a plurality of a second principal surface side connection terminals arranged on a second principal surface of the stacked configuration; and the plurality of conductor layers arranged in the plurality of resin insulating layers, and connected by a via conductor that becomes expanded in diameter along the direction of facing the first principal surface; the method comprising: a base preparing process that prepares a base on which stacking metal foils are stacked in a peelable state; a buildup process that alternately stacks the plurality of conductor layers and the plurality of resin insulating layers on the stacking metal foils to form the stacked configuration; an opening forming process that performs, after the buildup process, a laser drilling process on a resin insulating layer of an uppermost outer layer to thereby form a plurality of openings, each opening exposing a conductor layer portion corresponding to a lower terminal part of each of the plurality of first principal surface side connection terminals; an entire plating process that performs electroless copper plating on the stacked configuration to form an entire plating layer that covers the plurality of openings and the plurality of resin insulating layers; a terminal forming process that partly etches, after the entire plating process, the entire plating layer formed on the resin insulating layer of the uppermost outer layer to form an upper terminal part of each of the plurality of first principal surface side connection terminals at a region surrounding an upper portion of each opening; and, a base removing process that removes the base after the opening forming process and the terminal forming process. According to the third illustrative aspect of the invention, the first principal surface side connection terminal which is formed of the upper terminal part and the lower terminal part may accurately be formed.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE PRESENT INVENTION

First Illustrative Embodiment

Hereinafter, the detailed multilayer wiring substrate according the first illustrative embodiment of the invention will be described with reference to the drawings.

Figure 1:
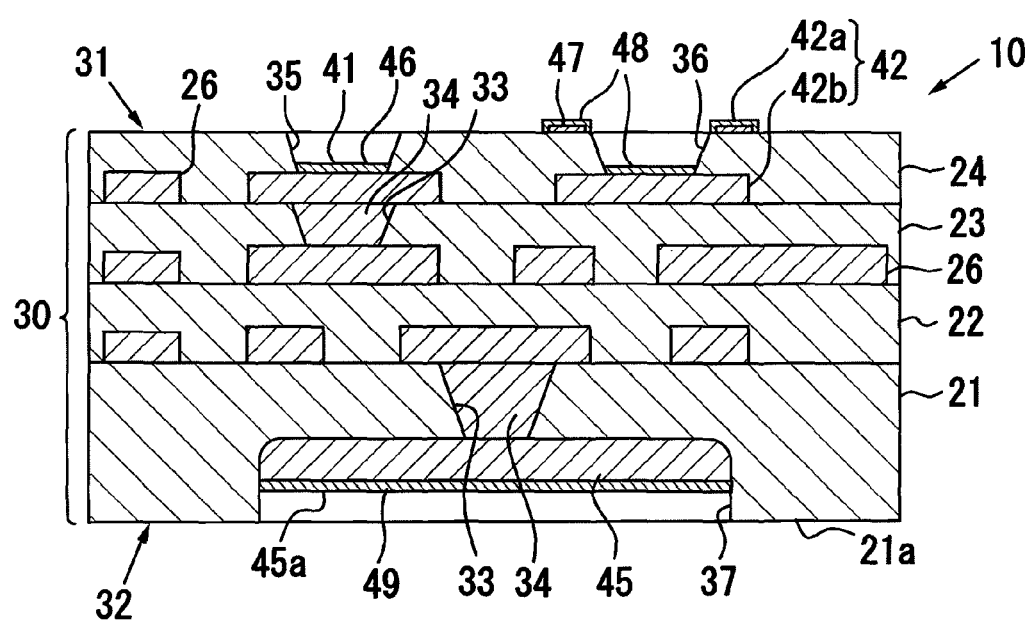
FIG. 1 is a sectional view showing a schematic configuration of a multilayer wiring substrate according to a first illustrative embodiment of the invention.
Figure 2:
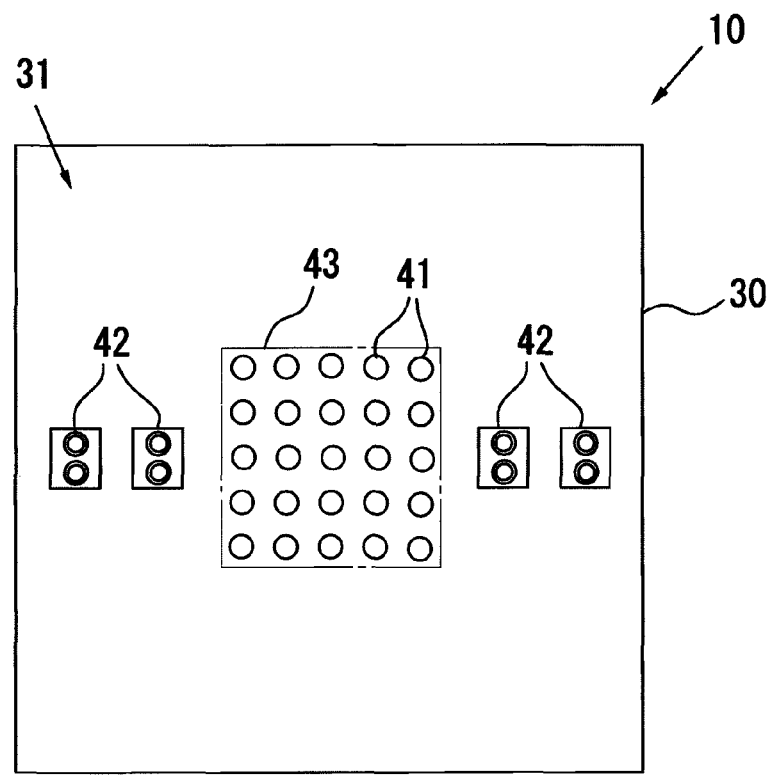
FIG. 2 is a plane view showing a schematic configuration of a multilayer wiring substrate according to a first illustrative embodiment of the invention.

FIG. 1 is an enlarged sectional view showing a schematic configuration of a multilayer wiring substrate according to the first illustrative embodiment of the invention. FIG. 2 is a plane view of the multilayer wiring substrate as viewed from above and FIG. 3 is a plane view of the multilayer substrate as viewed from below.

As shown in FIG. 1, the multilayer wiring substrate 10 is a coreless wiring substrate formed without a core substrate, and has a wiring stacked portion 30 (stack structure) multilayered by alternately stacking four layers of resin insulating layers 21, 22, 23, 24 that are formed with a same resin insulating material as a main element and a conductor layer 26 formed with copper. Each of the resin insulating layers 21 to 24 is formed by employing a resin insulating material having no photocurable property, in more detail, a buildup material containing a cured product of thermosetting epoxy resin as a main material. In the multilayer wiring substrate 10, an upper surface 31 (first principal surface side) of the wiring stacked portion 30 is arranged thereon with a plurality of connection terminals 41, 42 (first principal surface side connection terminals).

As shown in FIGS. 1 and 2, the multilayer wiring substrate 10 of the first illustrative embodiment of the invention contains an IC chip connection terminal 41 to be connected to an IC chip as a connection target and a capacitor connection terminal 42 (connection terminal of passive element) to be connected to a chip capacitor (passive element), as a plurality of connection terminals 41, 42 that are arranged at the upper surface 31 of the wiring stacked portion 30. At the side of the upper surface 31 of the wiring stacked portion 30, the plurality of IC chip connection terminals 41 are disposed in an array on the chip mounting region 43 positioned at the substrate center. In addition, the capacitor connection terminal 42 is a connection terminal, which is greater in area than the IC chip connection terminal 41, and arranged at an outer side of the chip mounting region 43.

Figure 3:
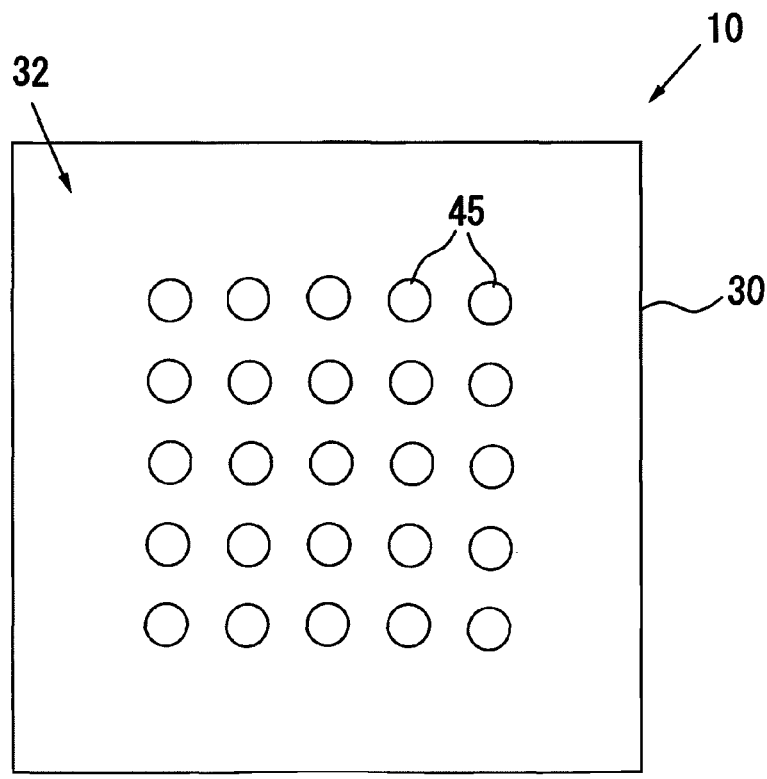
FIG. 3 is a plane view showing a schematic configuration of a multilayer wiring substrate according to a first illustrative embodiment of the invention.

Meanwhile, as shown in FIG. 1 and FIG. 3, at the lower surface 32 side (second principal surface side) of the wiring stacked portion 30, a plurality of connection terminals 45 (connection terminals for a mother substrate as second principal surface side connection terminals) for a LGA (land grid array) of which a connection target is a mother board (mother substrate) are disposed in an array. These connection terminals 45 for the mother substrate are wider in area than the IC chip connection terminal 41 of the upper surface 31 side and the capacitor connection terminal 42.

The resin insulating layers 21, 22, 23, 24 each are provided therein with via holes 33 and via conductors 34. The via conductors 34 all have a shape in which its diameter becomes expanded in a same direction (along the direction of the lower surface side to the upper surface side, as shown in FIG. 1), and serve to electrically connect the conductor layers 26, IC chip connection terminals 41, capacitor connection terminals 42 and connection terminals 45 for the mother substrate to each other in an operable manner.

In the upper surface 31 of the wiring stacked portion 30, an opening 35 is formed in the resin insulating layer 24 of the fourth layer which has been exposed as the uppermost outer layer, and the IC chip connection terminal 41 is formed in the opening 35 in such a manner that its upper surface is lower in height than the surface (reference surface) of the resin insulating layer 24. The IC chip connection terminal 41 is formed of copper as a main material, and has a configuration in which only the upper face of the copper layer that is exposed within the opening 35 is covered with a plating layer 46 (in detail, nickel-gold plating layer). And, the upper face of the IC chip connection terminal 41 as exposed is adapted to be flip-chip connected to the IC chip through a solder bump (not shown).

Figure 4:
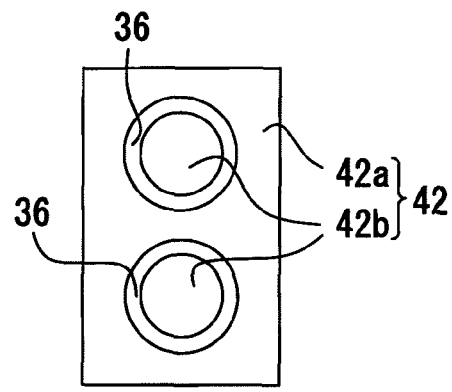
FIG. 4 is a plane view showing a capacitor connection terminal according to a first illustrative embodiment of the invention.

As shown in FIG. 1 and FIG. 4, the capacitor connection terminal 42 is formed of an upper terminal part 42a that is formed on the resin insulating layer 24 of the uppermost outer layer, and a lower terminal part 42b that is formed on the resin insulating layer of the inner layer. In the resin insulating layer 24 of the uppermost outer layer, an opening 36 is formed at a plurality of portions (two portions in the present illustrative embodiment) that are in the inner side region of the upper terminal part 42a, and a lower terminal part 42b is arranged at a portion corresponding to the opening 36. In the present illustrative embodiment, the resin material of the resin insulating layer 24 is exposed at the inner side surface of the opening 36.

The upper terminal part 42a of the capacitor connection terminal 42 is formed at a position higher in its upper surface than the surface (reference surface) of the resin insulating layer 24, and the lower terminal part 42b is formed at a portion identical in height to the upper surface of the IC chip terminal 41. That is, in the multilayer wiring substrate 10 according to the present illustrative embodiment of the invention, the upper surface of the IC chip connection terminal 41 is different in its height from the upper surface of the capacitor connection terminal 42, the upper surface of the capacitor connection terminal 42, which is relatively greater in area, is configured to be higher than the upper surface of the IC chip connection terminal 41, which is relatively small in area.

The upper terminal part 42a of the capacitor connection terminal 42 has a copper layer 47, which is formed on the resin insulating layer 24 of the uppermost outer layer, and a plating layer 48 (coating metal layer), which is formed to cover the upper surface and lateral surface of the copper layer 47. In the upper terminal part 42a, the thickness (approximately 5 μm) of the copper layer 47 is thinner than the thickness (approximately 8 μm) of the plating layer 48, and the total thickness of the copper layer 47 and the plating layer 48 is below 15 μm. The plating layer 48 is formed of metal other than copper. According to the present illustrative embodiment of the invention, the plating layer 48 is made of two layers of an electroless nickel plating layer and an electroless gold plating layer.

The lower terminal part 42b of the capacitor connection terminal 42 is formed of a copper layer as a main element, and only the upper surface of copper layer exposed within the opening 36 is covered with a plating layer 48 (in detail, nickel-gold plating layer) other than copper. And, in the capacitor connection terminal 42, the opening 36 is filled with solder (not shown), thereby the upper terminal part 42a and the lower terminal part 42b are electrically connected each other, and an external terminal of a chip capacitor is connected to it through the solder.

As shown in FIG. 1, at the lower surface 32 side of the wiring stacked portion 30, a plurality of openings 37 are formed in the resin insulating layer 21 of the most outer layer as exposed, and a mother substrate connection terminal 45 is arranged in response to the position of the plurality of openings 37. In detail, the mother substrate connection terminal 45 is formed of copper as a main material and a terminal outer face 45a is arranged at an inner side recessed from the surface 21a of the resin insulating layer 21 of the most outer layer. In addition, the mother substrate connection terminal 45 has a configuration in which only the upper surface of the copper layer that is exposed within the opening 37 is covered with a plating layer 49 (in detail, nickel-gold plating layer) other than copper. And, the outer surface of the mother substrate connection terminal 45 is connected to a mother board through soldering (not shown).

The multilayer wiring substrate 10 as configured above may be fabricated in the following sequence, for instance.

First, in the buildup process, a supporting substrate (glass epoxy substrate, etc.) having sufficient solidity is prepared, and the wiring stacked portion 30 is formed on the supporting substrate by building up the resin insulating layers 21 to 24 and the conductor layers 26.

Figure 5:
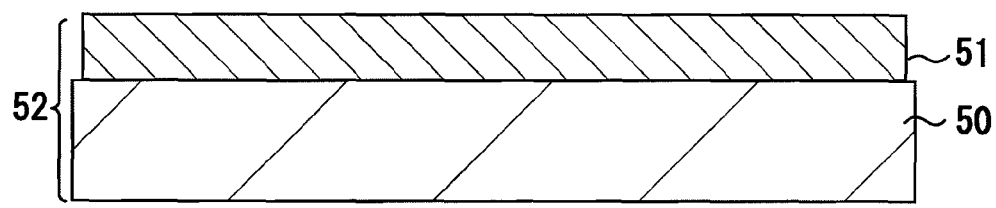
FIG. 5 is an explanatory view showing a method of fabricating a multilayer wiring substrate according to a first illustrative embodiment of the invention.
Figure 6:
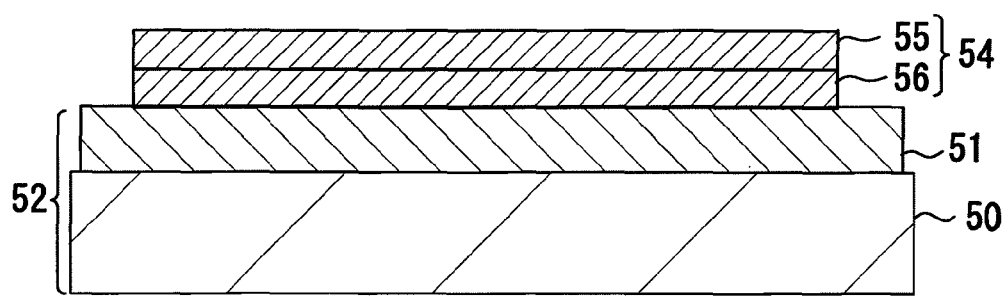
FIG. 6 is an explanatory view showing a method of fabricating a multilayer wiring substrate according to a first illustrative embodiment of the invention.

It will be described in more detail as follows. As shown in FIG. 5, a base resin insulating layer 51 is formed by applying an adhesive sheet type of insulating resin based material, which is made of epoxy resin, on a supporting substrate 50, thereby obtaining a base plate 52 that is formed of supporting substrate 50 and the base resin insulating layer 51. And, as shown in FIG. 6, a stacked metal sheet 54 is arranged on an upper surface of the base resin insulating layer 51 (base preparing process). Herein, the stacked metal sheet 54 is arranged on the base resin insulating layer 51, thereby, the adhesion is secured so that the stacked metal sheet 54 may not be peeled from the base resin insulating layer 51 in the following manufacturing processes. The stacked metal sheet 54 is formed by adhering two sheets of copper foils 55, 56 (stacking metal foils) in a peelable state. In detail, the stacked metal sheet 54 is formed in an array of the copper foil 55 and copper foil 56 through the metal plating (e.g., chromium plating, nickel plating, titanium plating, or a compound of these platings).

Figure 7:
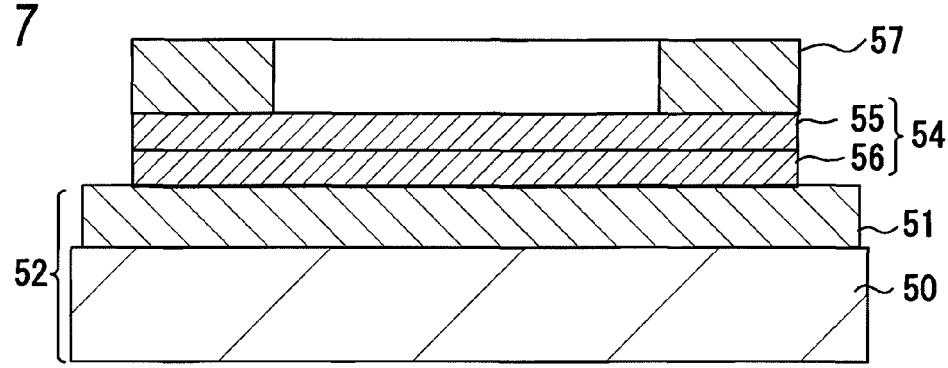
FIG. 7 is an explanatory view showing a method of fabricating a multilayer wiring substrate according to a first illustrative embodiment of the invention.
Figure 8:
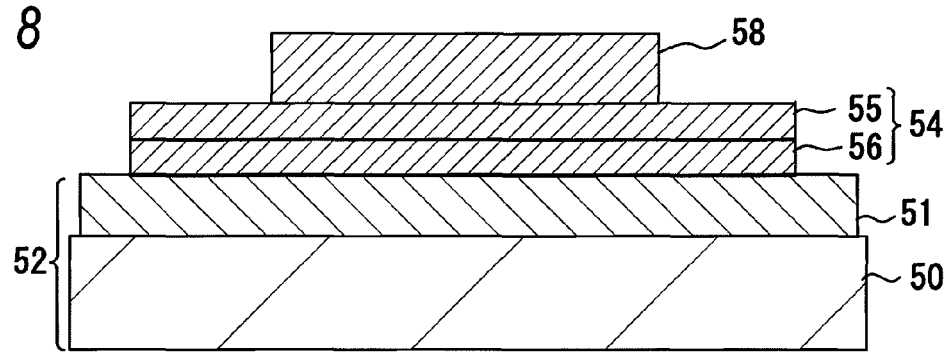
FIG. 8 is an explanatory view showing a method of fabricating a multilayer wiring substrate according to a first illustrative embodiment of the invention.

Thereafter, a metal conductor corresponding to the mother substrate connection terminal 45 is formed on the stacked metal sheet 54. In more detail, the entire surface plating layer covering the stacked metal sheet 54 or the base 52 is formed by performing electroless copper plating (not shown). A dry film for forming plating resist is laminated on the upper surface of the stacked metal sheet 54, and the dry film is exposed and developed. As a result, a predetermined pattern of plating resist 57 having an opening at a portion corresponding to the mother substrate connection terminal 45 (see FIG. 7) is prepared. And, electro copper plating is selectively performed at the state that the plating resist 57 has been formed, thereby a metal conductor 58 is formed on the stacked metal sheet 54, and the plating resist 57 is peeled (see FIG. 8).

Figure 9:
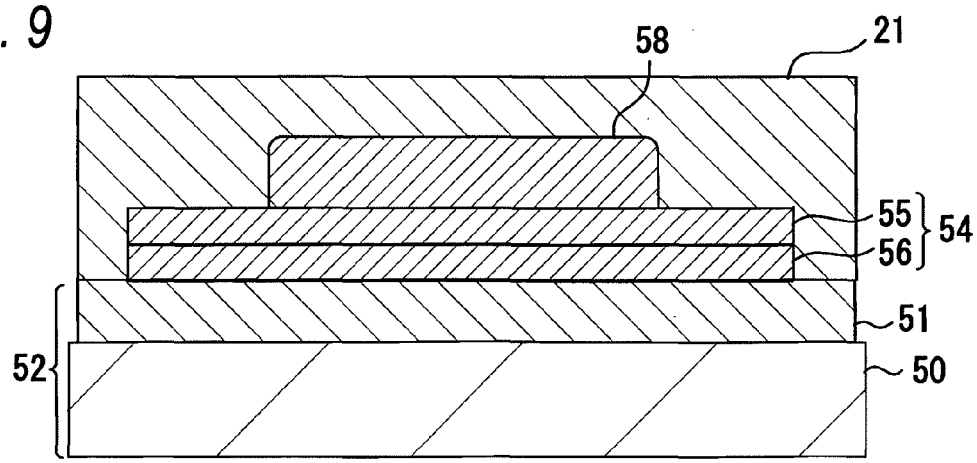
FIG. 9 is an explanatory view showing a method of fabricating a multilayer wiring substrate according to a first illustrative embodiment of the invention.

After the formation of the metal conductor 58, the surface of the metal conductor 58 is processed by a roughening process (CZ process) to enhance the adhesion between the resin insulating layer and the metal conductor 58. At this time, the surface of the metal conductor 58 is roughened and at the same time an edge of the metal conductor 58 is rounded. Next, as shown in FIG. 9, a sheet type of resin insulating layer 21 is arranged to surround the stacked metal sheet 54 on which the metal conductor 58 is formed, thereafter adhering of the resin insulating layer 21 is performed. Herein, the resin insulating layer 21 is firmly adhered to the stacked metal sheet 54 and the metal conductor 58, and at the same time, adhered to the base resin insulating layer 51 at the surrounding region of the stacked metal sheet 54, thereby sealing the stacked metal sheet 54.

Figure 10:
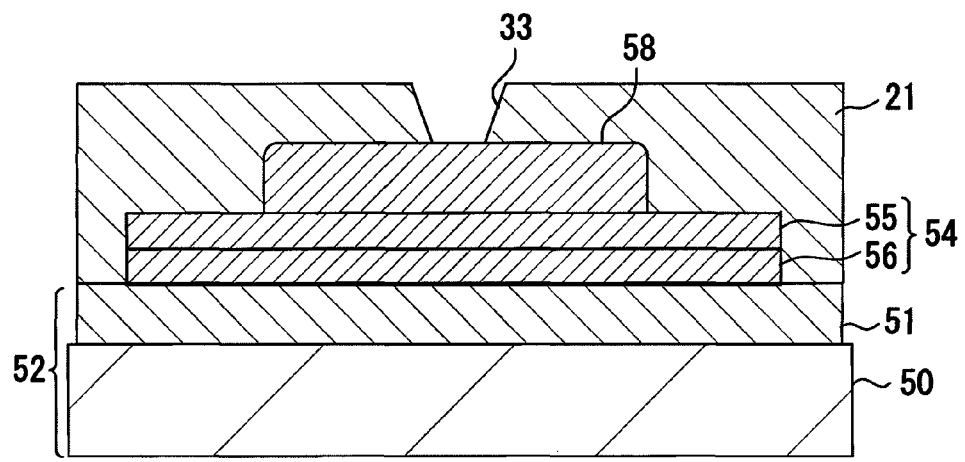
FIG. 10 is an explanatory view showing a method of fabricating a multilayer wiring substrate according to a first illustrative embodiment of the invention.

As shown in FIG. 10, via hole 33 is formed at a predetermined position (a upper portion of the metal conductor 58) of the resin insulating layer 21 by performing a laser process, for instance, employing Excimer laser, or UV laser, or $CO_2$ laser, etc. Subsequently, smear in each of the via holes 33 may be eliminated through a desmear process that employs etching solutions such as potassium permanganate solution, etc. In the meanwhile, in the desmear process, a plasma ashing process using $O_2$ plasma other than the process using etching solutions may be executed.

Figure 11:
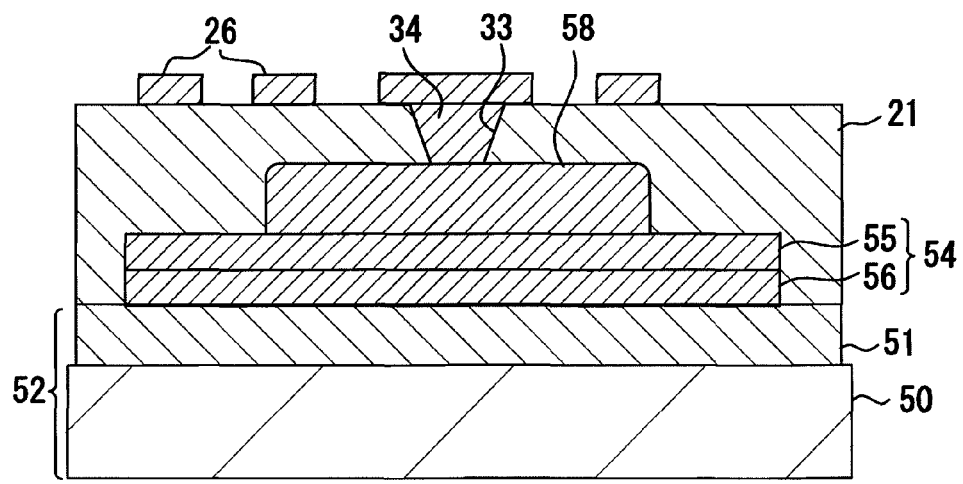
FIG. 11 is an explanatory view showing a method of fabricating a multilayer wiring substrate according to a first illustrative embodiment of the invention.

After the desmear processing, via conductors 34 are formed within each of the via holes 33 by performing electroless copper plating and electro copper plating according to a conventional method. In addition, a conductor layer 26 is patterned on the resin insulating layer 21 by performing an etching process according to a conventional method (for instance, a semi additive method) (see FIG. 11).

Figure 12:
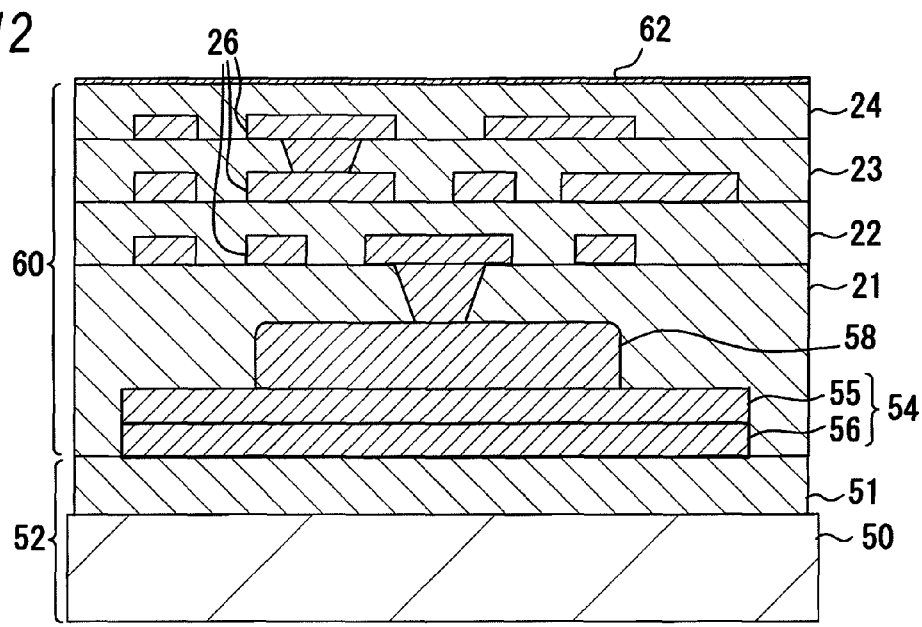
FIG. 12 is an explanatory view showing a method of fabricating a multilayer wiring substrate according to a first illustrative embodiment of the invention.

In addition, the resin insulating layers 22 to 24 of the second to fourth layers and the conductor layer 26 are formed by the same method as that for the resin insulating layer 21 of first layer and conductor layer 26, stacking them on the resin insulating layer 21 (buildup process). Herein, the resin insulating layer 24 of the most outer layer is formed by employing a buildup material having a copper foil, and the other resin insulating layers 22, 23 are formed by using a common buildup material having no copper foil. As a result, as shown in FIG. 12, a wiring stacked portion 60, which is multilayered by alternately stacking the plurality of resin insulating layers 21 to 24 and the plurality of conductors 26, is formed, and the upper face (the most outer surface of the resin insulating layer 60) of the wiring stacked portion 60 is coated with a copper foil 62 (a coating metal foil).

Figure 13:
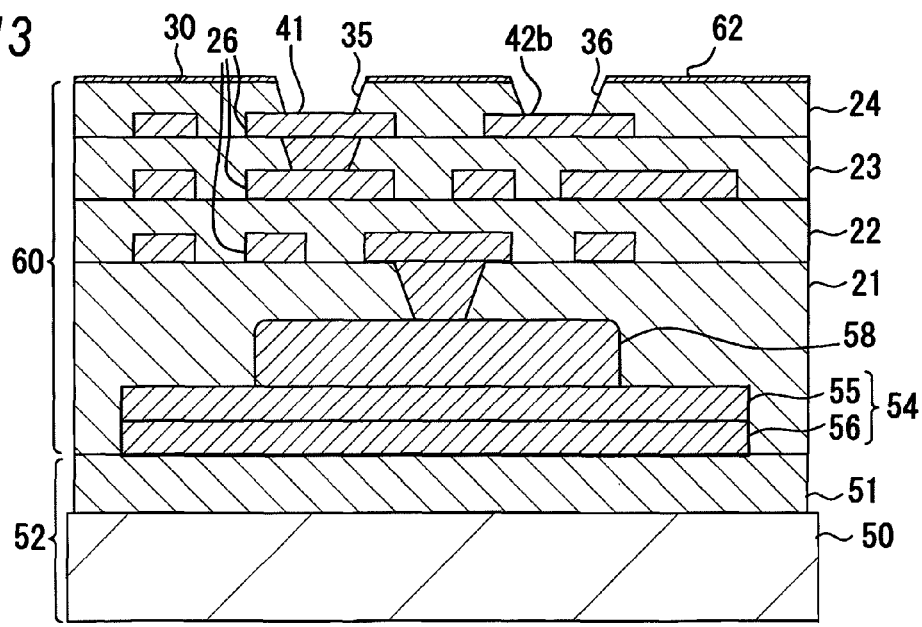
FIG. 13 is an explanatory view showing a method of fabricating a multilayer wiring substrate according to a first illustrative embodiment of the invention.
Figure 14:
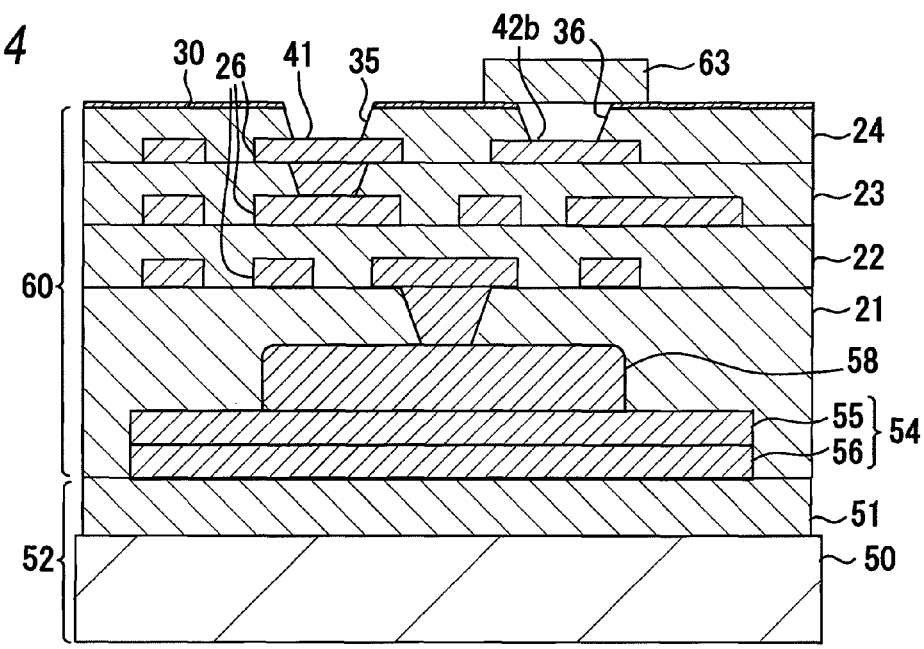
FIG. 14 is an explanatory view showing a method of fabricating a multilayer wiring substrate according to a first illustrative embodiment of the invention.

As shown in FIG. 13, the resin insulating layer 24 of the most outer layer is processed by a laser drilling process, thereby, the openings 35, 36 penetrating the copper foil 62 are formed in the resin insulating layer 24 (opening forming process). Subsequently, a desmear process is performed to eliminate smears in each of the openings 35, 36 by employing potassium permanganate solution or O2 plasma, etc. In the meanwhile, as show in FIG. 13, in the wiring stacked portion 60, the region positioned on the stacked metal sheet 54 corresponds to the wiring stacked portion 30 of the multilayer wiring substrate 10. In addition, in the wiring stacked portion 60, a part of the conductor 26 that is exposed through the opening 35 corresponds to the IC chip connection terminal 41, a part of the conductor 26 that is exposed through the opening 36 corresponds to the lower terminal part 42*b* of the capacitor connection terminal 42.

After the procedure of the desmear process, the copper foil 62 on the surface of the resin insulating layer 24 is partly etched, thereby the upper terminal part 42*a* of the capacitor connection terminal 42 is formed (terminal forming process). In more detail, a dry film for forming an etching resist is laminated on the upper face (the surface of the copper foil 62) of the wiring stacked portion 60, and the dry film is exposed and developed. Accordingly, a predetermined pattern of the etching resist 63 is formed to cover a portion (opening 36 and the outer edge) corresponding to the upper terminal part 42*a*. At the state, the wiring stacked portion 60 is etched to remove an unnecessary portion of the copper foil 62, thereby the upper terminal part 42*a* is formed on the resin insulating layer 24 of the most outer layer, and thereafter the etching resist 63 is peeled (see FIG. 15).

Figure 15:
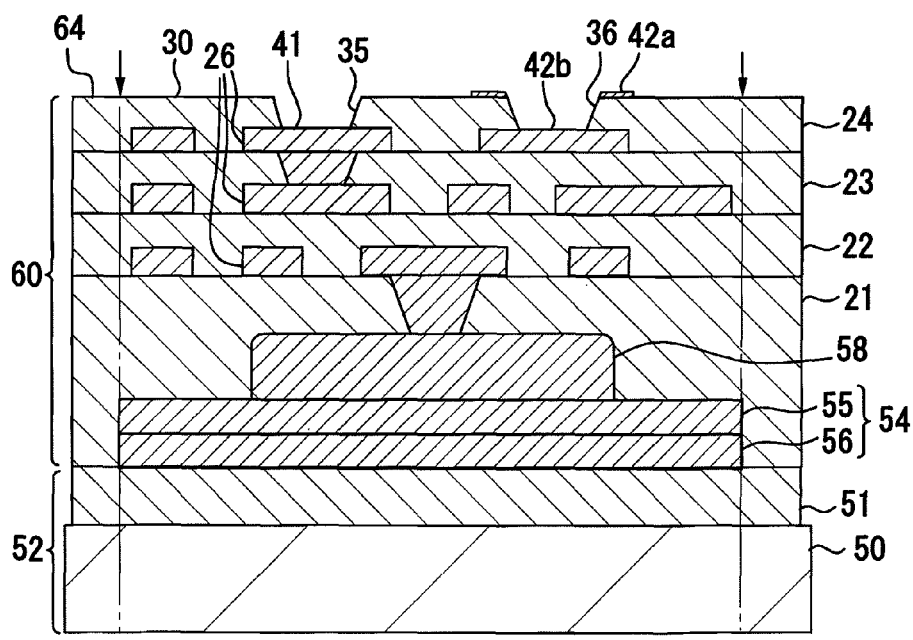
FIG. 15 is an explanatory view showing a method of fabricating a multilayer wiring substrate according to a first illustrative embodiment of the invention.

After the procedure of the opening forming process and the terminal forming process, the wiring stacked portion 60 is cut by a dicing device (not shown), thereby the surrounding region of the wiring stacked portion 30 is removed (cutting process). At this time, as shown in FIG. 15, along the boundary between the wiring stacked portion 30 and the surrounding portion 64 (boundary indicated by the arrow in FIG. 15), the base 52 (supporting substrate 50 and the base resin insulating layer 51) positioned below the wiring stacked portion 30 is whole cut. According to the cutting process, the outer edge portion of the stacked metal sheet 54, which has been sealed by the resin insulating layer 21), is exposed. That is, the surrounding portion 64 is removed thereby the adhering portion between base resin insulating layer 51 and the resin insulating layer 21 is removed. As a result, the wiring stacked portion 30 and the base 52 are connected only through the stacked metal sheet 54.

Figure 16:
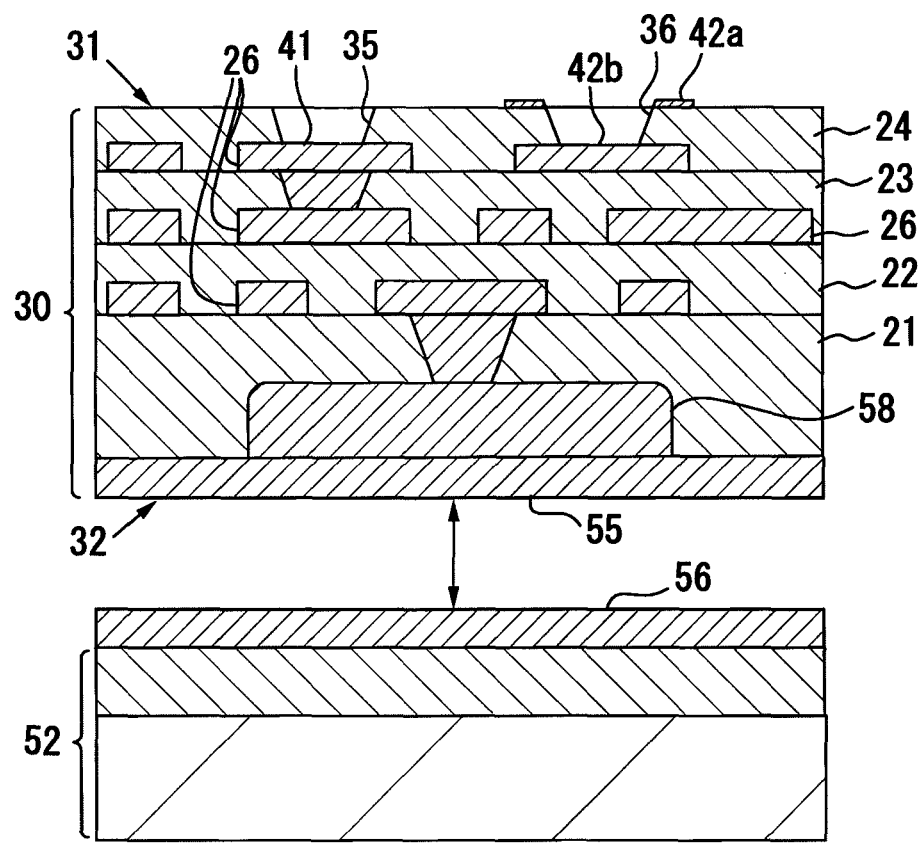
FIG. 16 is an explanatory view showing a method of fabricating a multilayer wiring substrate according to a first illustrative embodiment of the invention.

Herein, as shown in FIG. 16, in the stacked metal sheet 54, a pair of copper foils 55, 56 is peeled at the interface, thereby the base 52 is removed from the wiring stacked portion 30 to expose the copper foil 55 on the lower surface of the wiring stacked portion 30 (resin insulating layer 21).

Figure 17:
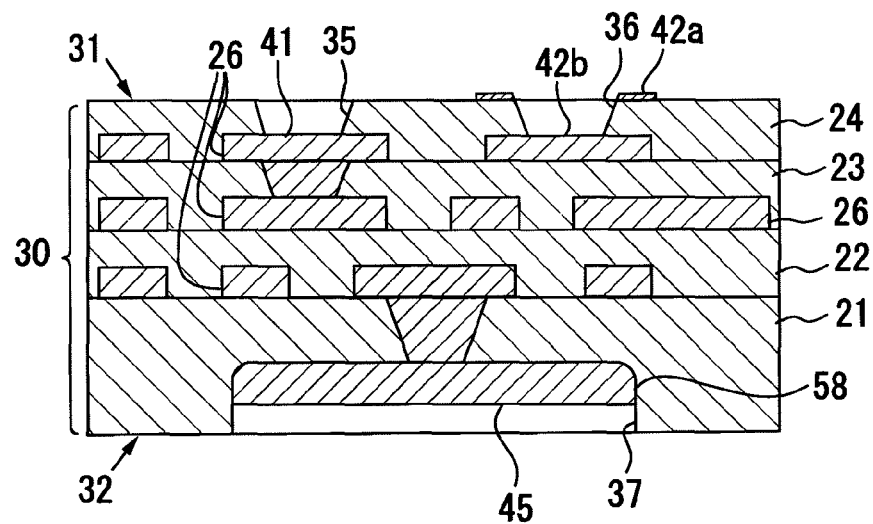
FIG. 17 is an explanatory view showing a method of fabricating a multilayer wiring substrate according to a first illustrative embodiment of the invention.

Thereafter, at the lower surface 32 side of the wiring stacked portion 30, the copper foil 55 is removed by etching while a portion of the metal conductor 58 remains, thereby forming the mother substrate connection terminal 45. In detail, a dry film for forming an etching resist is laminated on the upper surface 31 of the wiring stacked portion 30, and the dry film is exposed and developed, thereby forming an etching resist covering the entire surface of the upper surface 31. At the state, the wiring stacked portion 30 is etched to remove the copper foil 55 entirely, and at the same time, a lower portion of the metal conductor 58 is partly removed. As a result, an opening 37 is formed in the resin insulating layer 24, and the metal conductor 58 which remains in the opening 37 becomes the mother substrate connection terminal 45 (see FIG. 17).

Thereafter, the surface of the IC chip connection terminal 41, the surface of the capacitor connection terminal 42 (the upper surface and lateral surface of the terminal upper part 42*a* and the upper surface of the lower terminal part 42*b*) and the surface of the mother substrate connection terminal 45 are electroless-plated and electro-plated in sequence, thereby nickel-gold plating layers 46, 48, 49 are formed on each of the surfaces of terminals 41, 42, 45. The multilayer wiring substrate 10, as shown in FIG. 1, is fabricated through the above processes.

Accordingly, the following effect may be obtained according to the illustrative embodiment.

(1) According to the present embodiment, in the multilayer wiring substrate 10, the capacitor connection terminal 42 includes the upper terminal part 42a and the lower terminal part 42b, the upper terminal part 42a is formed on the resin insulating layer of the most outer layer, and each of the lower terminal part 42b is arranged in response to the openings 36 formed at a plurality of portions in the resin insulating layer 24. In addition, the IC chip terminal 41 is arranged in response to the opening 35 formed in the resin insulating layer 24, and the upper surface of the IC chip terminal 41 and the lower terminal part 42b of the capacitor connection terminal 42 are arranged at positions lower in height than the surface of the resin insulating layer 24 of the most outer layer. Accordingly, the resin insulating layer 24 of the most outer layer functions as a solder resist, thereby solder for connecting an IC chip or a chip capacitor may accurately be formed on each of the connection terminals 41, 42. In addition, in the capacitor connection terminal 42, two openings 36 are formed at the inner region of the upper terminal part 42a, and each of the openings 36 is filled with solder, thereby the upper terminal part 42a and the lower terminal part 42b may definitely electrically be connected. In this case, the upper terminal part 42a and the lower terminal part 42b of the capacitor connection terminal 42 are 3-dimensionally connected through solder, and the capacitor connection terminal 42 may be soldered and connected to a chip capacitor with sufficient solidity. In addition, the upper terminal part 42a included in the capacitor connection terminal 42 is arranged at a higher position than the surface of the resin insulating layer 24. That is, the upper surface of the capacitor connection terminal 42 (upper terminal part 42a) for connecting a chip capacitor is arranged at a higher position than the upper face of the IC chip connection terminal 41. If the IC chip connection terminal 41 and the capacitor connection terminal 42 are arranged as such, each of the connection terminals 41, 42 having a different height may definitely be connected to an IC chip and a chip capacitor.

(2) In the present embodiment, the upper terminal part 42a of the capacitor connection terminal 42 has a copper layer 47 and a plating layer 48, and the copper layer 47 is formed thinner than the plating layer 48. In this way, if the upper terminal part 42a is formed, the height (protruding amount) of the upper terminal part 42a may be lowered relative to the surface of the resin insulating, thereby solder paste print may easily be performed on the upper terminal part 42a. In addition, if the upper terminal part 42a is formed low in height, solder is not expanded in a horizontal direction, thereby the capacitor connection terminal 42 may be arranged in a reduced inter-terminal pitch. In addition, in a case where the upper terminal part 42a is formed thickly, it is necessary to perform an additional electro copper plating process by a semi additive method. According to the present embodiment, the copper layer 47 forming the upper terminal part 42a is thin to a thickness of 5 µm, thereby the electro copper plating process may be omitted. As a result, the number of processes in forming the multilayer wiring substrate 10 may be reduced.

(3) In the multilayer wiring substrate 10, according to the present illustrative embodiment of the invention, the upper terminal part 42a of the capacitor connection terminal 42 has a configuration in which the upper face and lateral face of the copper layer 47 are covered with the plating layer 48. In this way, the upper terminal part may definitely be formed thereon with solder, thereby a chip capacitor may be soldered connected thereto with sufficient solidity.

Second Illustrative Embodiment

Figure 18:
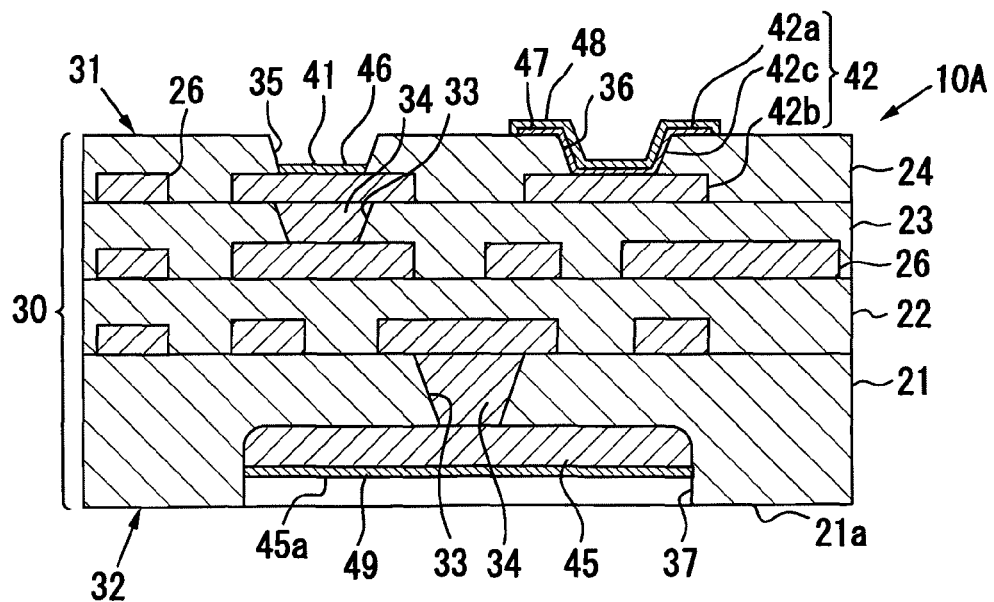
FIG. 18 is a sectional view showing a schematic configuration of a multilayer wiring substrate according to a second illustrative embodiment of the invention.

Next, according to a second illustrative embodiment of the invention, a multilayer wiring substrate will be described in detail with reference to the drawings. As shown in FIG. 18, in a multilayer wiring substrate 10A according to the present illustrative embodiment, the capacitor connection terminal 42 that is formed at the upper face 31 side of the wiring stacked portion 30 and the fabrication method are different from those in the first illustrative embodiment. Hereinafter, the difference between the first illustrative embodiment and the second illustrative embodiment will mainly be described.

Figure 19:
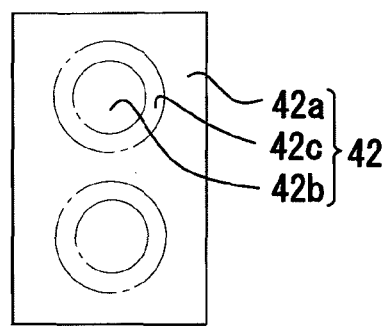
FIG. 19 is a plane view showing a capacitor connection terminal according to a second illustrative embodiment of the invention.

As shown in FIG. 18 and FIG. 19, the capacitor connection terminal 42 includes the upper terminal part 42a that is formed on the resin insulating layer 24 of the uppermost outer layer, the lower terminal part 42b that is formed on the resin insulating layer 23 of the inner side layer, and a middle terminal part 42c that serves to connect the upper terminal part 42a and the lower terminal part 42b. The middle terminal part 42c is formed of the copper layer 47 and the plating layer 48 like in the upper terminal part 42a to thereby cover the entire inner side of the opening 36. That is, according to the present illustrative embodiment, the resin material of the resin insulating layer 24 in the inner side of the opening 36 is not exposed, unlike the first illustrative embodiment of the invention. In addition, in the first illustrative embodiment, the copper layer 47 of the upper terminal part 42a has been formed with a copper foil 62 of a copper foil containing buildup material. In contrast, according to the present illustrative embodiment, the copper layer 47 forming the upper terminal part 42a and the middle terminal part 42c is formed with an electroless copper plating layer. Meanwhile, the plating layer 48 (coating metal layer) forming the upper terminal part 42a and the middle terminal part 42c is formed of two layers of an electroless nickel plating layer and an electroless gold layer like in the first illustrative embodiment of the invention.

According to the present illustrative embodiment of the invention, the multilayer wiring substrate 10A is fabricated in the following sequence.

Figure 20:
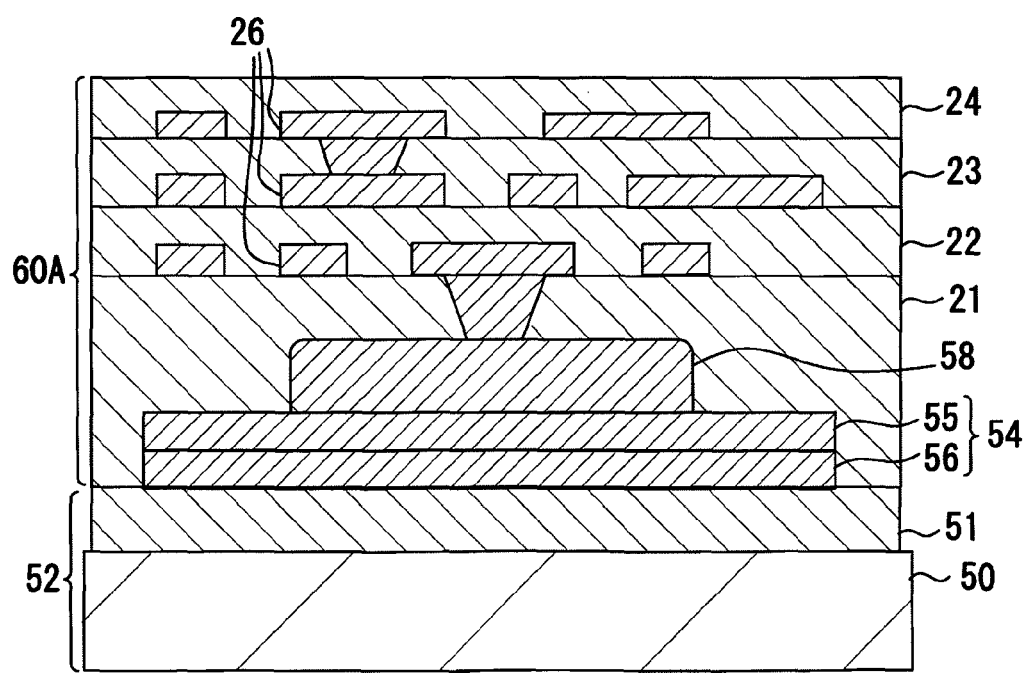
FIG. 20 is an explanatory view showing a method of fabricating a multilayer wiring substrate according to a second illustrative embodiment of the invention.

First, the wiring stacked portion 60A, as shown in FIG. 20, is formed by performing a buildup process like in the first illustrative embodiment of the invention. Meanwhile, according to the present illustrative embodiment of the invention, the resin insulating layer 24 of the uppermost outer layer, like the resin insulating layers 21 to 23 of the inner layer side, is also included in the wiring stacked portion 60A with a common buildup material having no copper foil.

Figure 21:
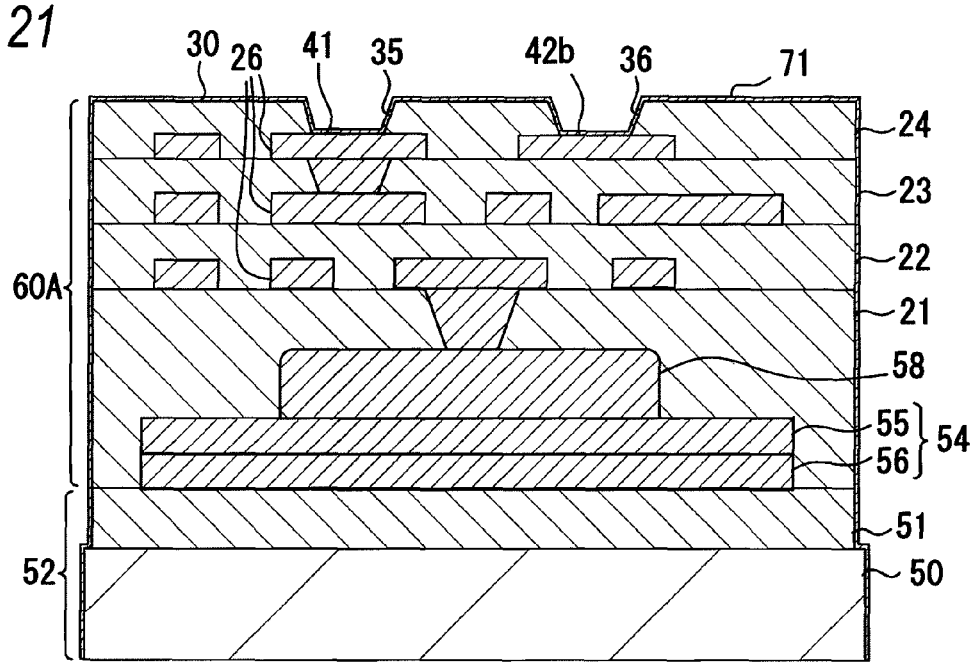
FIG. 21 is an explanatory view showing a method of fabricating a multilayer wiring substrate according to a second illustrative embodiment of the invention.

After the buildup processing, the resin insulating layer 24 of the most outer layer is processed by a laser drilling process, thereby a plurality of openings 35, 36 are formed on the resin insulating layer 24. In addition, smear in each of the openings 35, 36 may be eliminated through a desmear process that employs etching solutions or $O_2$ plasma, etc. Thereafter, as shown in FIG. 21, an entire plating layer 71, which entirely covers the inside of the openings 35, 36 in the resin insulating layer 24 and the resin insulating layer 21 to 24, is formed by performing the electroless copper plating (entirely plating process).

Figure 22:
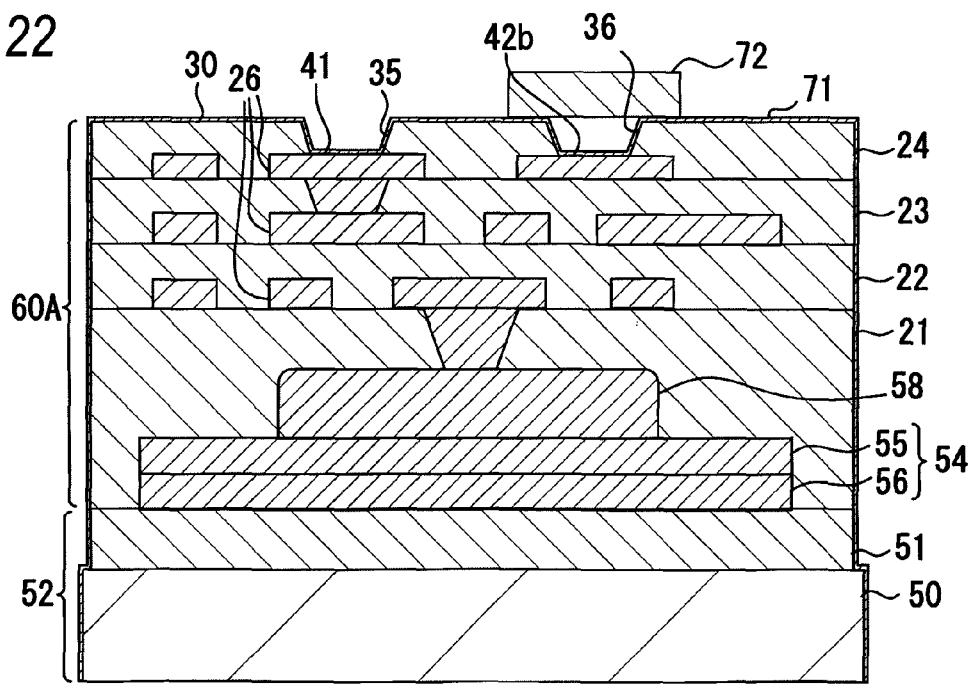
FIG. 22 is an explanatory view showing a method of fabricating a multilayer wiring substrate according to a second illustrative embodiment of the invention.
Figure 23:
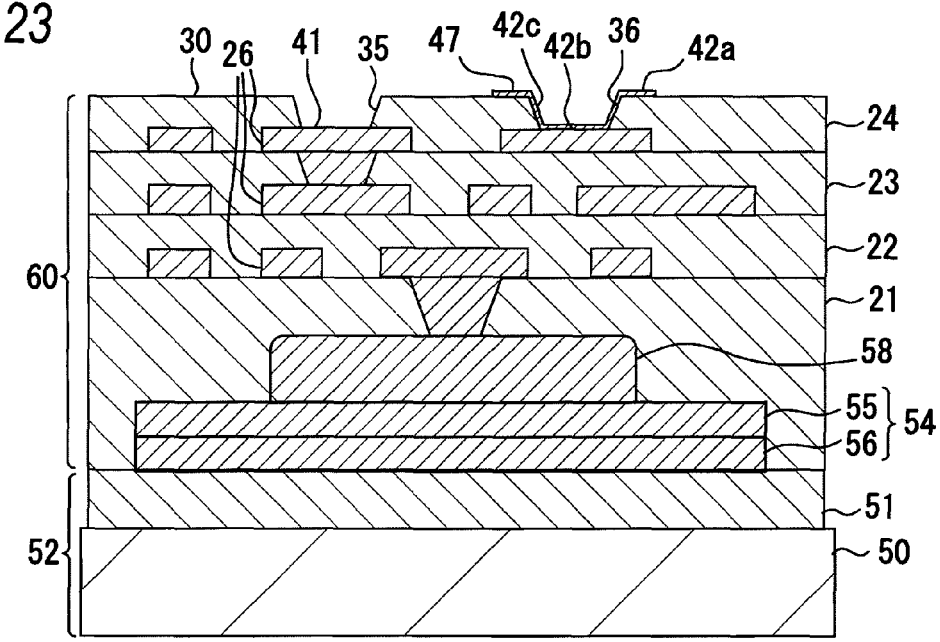
FIG. 23 is an explanatory view showing a method of fabricating a multilayer wiring substrate according to a second illustrative embodiment of the invention.

After the entirely plating process, the entire plating layer 71 is partly etched, thereby the copper layer 47 of the upper terminal part 42a and the middle terminal part 42c of the capacitor connection terminal 42 is formed (terminal forming process). In more detail, on the upper surface (the surface of the entire plating layer 71) of the wiring stacked portion, a dry film for forming an etching resist is laminated, the dry film is exposed and developed, thereby forming a predetermined pattern of etching resist 72 that covers a portion corresponding to the upper terminal part 42a (see FIG. 22). At this state, the wiring stacked portion 60A is etched to remove an unnecessary portion of the entire plating layer 71, thereby forming the copper layer 47 on the resin insulating layer 24 of the uppermost outer layer and in the opening 36, and then peeling the etching resist 72 (see FIG. 23). Meanwhile, the copper layer 47, which is formed at the region surrounding an upper edge portion of the opening 36 on the resin insulating layer 24, corresponds to the upper terminal part 42a, and the copper 47 which is formed at the inner side of the opening 36 corresponds to the middle terminal part 42c.

Thereafter, like in the first illustrative embodiment of the invention, the plurality of resin insulating layers 21 to 24 and the plurality of conductors 26 are alternately stacked while a cutting process and a base removing process are performed, thereby forming the multilayered wiring stacked portion 30. Thereafter, at the lower surface 32 side of the wiring stacked portion 30, the copper foil 55 is etched and removed while a portion of the metal conductor 58 remains, thereby forming the mother substrate connection terminal 45.

In addition, the surface of the IC chip connection terminal 41, the surface of the capacitor connection terminal 42, and the surface of the mother substrate connection terminal 45 are plated by performing the electroless nickel plating and electroless gold plating in sequence, thereby the nickel-gold plating layers 46, 48, 49 are formed on each surface of the terminals 41, 42, 45. During the procedure of the above processes, the multilayer wiring substrate 10A is fabricated, as shown in FIG. 18.

The multilayer wiring substrate 10A fabricated according to the present illustrative embodiment also may have the same effect as in the first illustrative embodiment of the invention.

In the meanwhile, each of the embodiments of the invention may be modified as follows.

Figure 24:
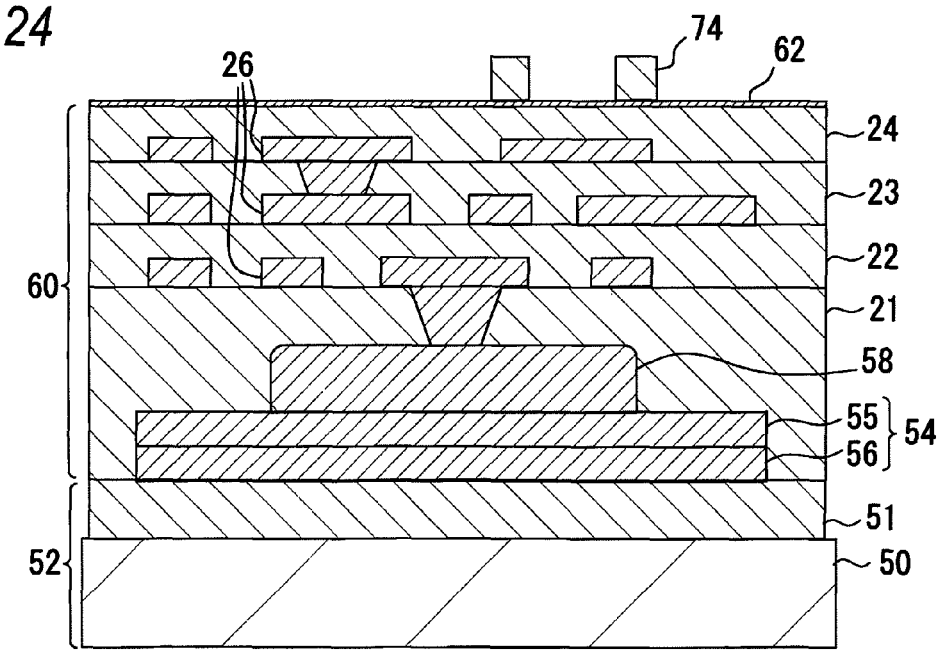
FIG. 24 is an explanatory view showing a method of fabricating a multilayer wiring substrate according to another illustrative embodiment of the invention.

According to the first illustrative embodiment of the invention, the openings 35, 36 are formed in the resin insulating layer 24, and then the upper terminal part 42a of the capacitor connection terminal 42 are formed on the resin insulating layer 24 by performing the terminal forming process. The invention, however, is not limited to such a case. In the first illustrative embodiment, it may be modified in such a manner that the terminal forming process is performed and then the opening forming process is performed. For example, the wiring stacked portion 60 as shown in FIG. 12 is formed by a buildup process, and then the terminal forming process is performed. During the terminal forming process, the upper surface (the surface of the copper foil 62) of the wiring stacked portion 60 is formed thereon with a predetermined pattern of etching resist 74 that covers a portion corresponding to the upper terminal part 42a (see FIG. 24). The etching resist 74 is formed therein with a through hole corresponding to the formation portion of the opening 36.

Figure 25:
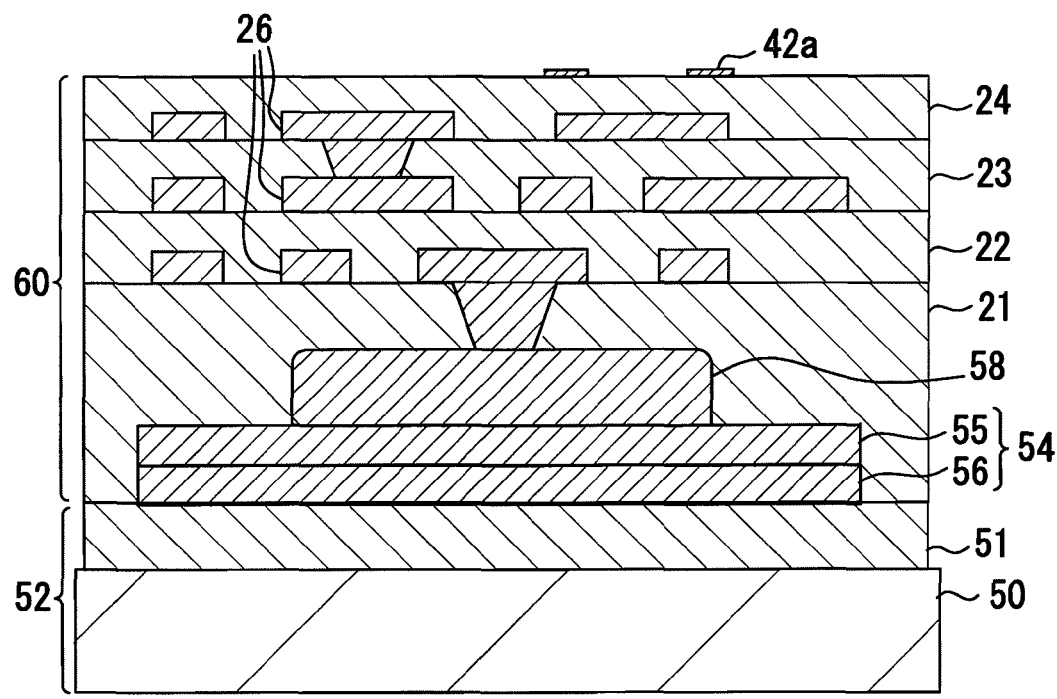
FIG. 25 is an explanatory view showing a method of fabricating a multilayer wiring substrate according to another illustrative embodiment of the invention.

At the state that the etching resist 74 has been formed, the wiring stacked portion 60 is etched to remove an unnecessary portion of the copper foil 62, thereby the upper terminal part 42a is formed on the resin insulating layer 24 of the uppermost outer layer, and then the etching resist 74 is peeled (see FIG. 25). At this time, the upper terminal part 42a is formed therein with a through hole exposing the resin insulating layer 24. After the terminal forming process, the opening forming process is executed and the resin insulating layer 24 of the uppermost outer layer is processed through laser drilling, thereby the plurality of the openings 35, 36 are formed in the resin insulating layer 24 (see FIG. 15). Meanwhile, herein, laser illuminates a position of the through hole that is formed in the upper terminal part 42a, thereby the opening 36 is formed. In this way, since there is no need to process the copper foil 62 by a laser drilling process, the opening 36 may accurately be formed in the resin insulating layer 24 while laser output is prevented.

Figure 26:
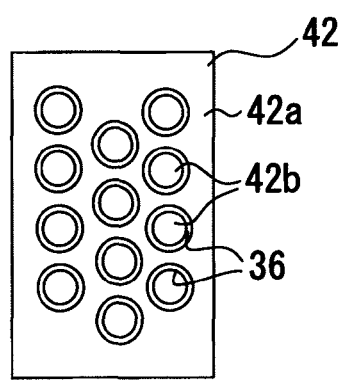
FIG. 26 is a plane view showing a capacitor connection terminal according to another illustrative embodiment of the invention.

In each of the illustrative embodiments, two openings 36 are formed for one capacitor connection terminal 42. However, the invention is not limited to such a case, but a relatively large number of openings 36 may be formed, like the capacitor connection terminal 42 as shown in FIG. 26. In this case, since the size of each opening 36 may be reduced, laser drilling process may be used usefully. In addition, since an anchor effect caused by the bumps of the opening 36 may be obtained uniformly, reliability in connecting of the capacitor connection terminal 42 may be enhanced. In addition, a plurality of openings 36 each that are different in size or shape may be formed for one capacitor connection terminal 42. In this way, if the plurality of openings 36 are formed for one capacitor connection terminal 42, since a plurality of connecting routes are formed through solder, the upper terminal part 42 and the lower terminal part 42b may definitely electrically be connected by one connecting route in one opening 36, even though another connecting route in another opening 36 is cut.

In each of the illustrative embodiments, the plating layers 46, 48, 49 coating each of the connection terminals 41, 42, 45 are nickel-gold plating layers, but a plating layer other than copper plating layer may be allowed, for example, a plating layer such as nickel-palladium-gold plating layer may replace the nickel-gold layer.

Next, technical spirits according to each of the illustrative embodiments as described in the foregoing will be listed as follows.

(1) A multilayer wiring substrate has a stacked configuration multilayered by alternately stacking a plurality of resin insulating layers formed with a same material as a main element and a plurality of conductor layers; a plurality of first principal surface side connection terminals are arranged on a first principal surface side of the stacked configuration; a plurality of second principal surface side connection terminals are arranged on a second principal surface side of the stacked configuration; the plurality of conductor layers are arranged in the plurality of resin insulating layers, and connected by via conductors that are expanded in diameter along the direction of facing the first principal surface side or the second principal surface, the plurality of resin insulating layers are formed with a same buildup material as a main element of cured product of a resin insulating material having no photocurable property; the principal surface side is provided thereon with two kinds of an IC chip connection terminal, which is connected to an IC chip as a connection target, and a passive element connection terminal, which is connected to a passive element as a connection target and greater in area than the IC chip connection terminal, as the plurality of first main side connection terminals; the IC chip connection terminal is arranged in response to an opening formed in a resin insulating layer of the uppermost outer layer that is exposed at the first principal surface side of the stacked configuration; the passive element connection terminal is formed of an upper terminal part formed on the resin insulating layer of the uppermost outer layer, and a lower terminal part arranged in response to an opening formed at a plurality of portions of inner side of the upper terminal part in the resin insulating layer of the uppermost outer layer; when a surface of the resin insulating layer of the uppermost outer layer is set as a reference, an upper face of the upper terminal part is higher than a reference face, an upper face of the IC chip connection terminal and the lower terminal part are identical in height to or lower in height than the reference face.

(2) In technical spirit (1), the all via conductors formed in the plurality of resin insulating layer expand in diameter as the first principal surface is approached.

(3) A method of manufacturing a multilayer wiring substrate having a stacked configuration multilayered by alternately stacking a plurality of resin insulating layers formed with a same material as a main element and a plurality of conductor layers; a plurality of first face side connection terminals are arranged on a first principal surface side of the stacked configuration; a plurality of a second principal surface side connection terminals are arranged on a second principal surface side of the stacked configuration; and the plurality of conductor layers are arranged in the plurality of resin insulating layers, and are connected by via conductors that are expanded in diameter along the direction of facing the first principal surface side, the method includes, a base preparing process that prepares a base that is formed by stacking metal foils to a peelable state; a buildup process that alternately stacks, as a multilayer, a plurality of conductor layers and a plurality of resin insulating layers that are formed of cured product of resin insulating material having no photocurable property to thereby form a stacked configuration in which a metal foil containing buildup material is arranged at the most outer layer; an opening forming process that forms openings of exposing a conductor layer corresponding to a lower terminal part of the first principal surface side connection terminal in the resin insulating layer of the uppermost outer layer, after the buildup process; a terminal forming process that partly etches the metal foil on the metal foil containing buildup material to thereby form an upper terminal part at the first principal surface side connection terminal, after the buildup process; and a base removing process that removes the base after the opening forming process and the terminal forming process.

(4) In technical sprit (3), the metal foil on the metal foil containing buildup material and the resin insulating layer of the uppermost outer layer are processed through laser drilling in the opening forming process.

What is claimed is:

1. A multilayer wiring substrate, comprising:
a stacked configuration that is multilayered by alternately stacking a plurality of resin insulating layers formed with a same material as a main element and a plurality of conductor layers;
a plurality of first principal surface side connection terminals that are arranged on a first principal surface of the stacked configuration; and,
a plurality of second principal surface side connection terminals that are arranged on a second principal surface of the stacked configuration,
wherein
the plurality of conductor layers are arranged in the plurality of resin insulating layers and connected by a via conductor which expands in diameter as either the first principal surface or the second principal surface is approached,
wherein,
the plurality of first principal surface side connection terminals include an IC chip connection terminal, which has an IC chip as a connection target, and a passive element connection terminal, which has a passive element as a connection target and is greater in area than the IC chip connection terminal;
the IC chip connection terminal is located in an opening formed in a resin insulating layer of an uppermost outer layer that is exposed at the first principal surface of the stacked configuration;
the passive element connection terminal is formed of an upper terminal part formed on the resin insulating layer of the uppermost outer layer, and a lower terminal part located in an opening formed at a portion of an inner side of the upper terminal part in the resin insulating layer of the uppermost outer layer;
wherein
a surface of the resin insulating layer of the uppermost outer layer defines a reference surface; and
wherein
an upper face of the upper terminal part is higher than the reference surface, and an upper face of the IC chip connection terminal and the lower terminal part are identical in height to or lower in height than the reference surface.

2. The multilayer wiring substrate according to claim 1, wherein
the upper terminal part comprises a copper layer formed on the resin insulating layer of the uppermost outer layer, and a coating metal layer formed on the copper layer and comprising metal other than copper.

3. The multilayer wiring substrate according to claim 2, wherein
a total thickness of the copper layer and the coating metal layer is less than or equal to 15 μm.

4. The multilayer wiring substrate according to claim 2, wherein
the copper layer of the upper terminal part is an electroless copper plating layer or copper foil layer, and the coating metal layer is formed of at least two layers including an electroless gold plating layer and an electroless nickel plating layer formed on the electroless copper plating layer or the copper foil layer.

5. The multilayer wiring substrate according to claim 2, wherein
an upper face and a lateral face of the copper layer are covered with the coating metal layer.

6. The multilayer wiring substrate according to claim 2, wherein
the opening formed at the portion of the inner side of the upper terminal part in the resin insulating layer of the uppermost outer layer serves to expose a resin material at the inner side.

7. The multilayer wiring substrate according to claim 1, wherein
the plurality of resin insulating layers are formed with a same buildup material as a main element of cured product of a resin insulating material having no photocurable property.

8. The multilayer wiring substrate according to claim 1, wherein
the all via conductors formed in the plurality of resin insulating layer expand in diameter as the first principal surface is approached.

9. A method of manufacturing a multilayer wiring substrate having: a stacked configuration multilayered by alternately stacking a plurality of resin insulating layers formed with a same material as a main element and a plurality of conductor layers; a plurality of first principal surface side connection terminals arranged on a first principal surface of the stacked configuration; a plurality of a second principal surface side connection terminals arranged on a second principal surface of the stacked configuration; and the plurality of conductor layers arranged in the plurality of resin insulating layers, and connected by a via conductor that becomes expanded in diameter along a direction of facing the first principal surface or the second principal surface;
the method comprising:
a base preparing process that prepares a base on which stacking metal foils are stacked in a peelable state;

a buildup process that alternately stacks the plurality of conductor layers and the plurality of resin insulating layers on the stacking metal foils to thereby form the stacked configuration and in which a coating metal foil is coated on a most outer surface of an uppermost outer layer thereof;

an opening forming process that forms, after the buildup process, an opening in a resin insulating layer of the uppermost outer layer, thereby exposing a conductor layer corresponding to a lower terminal part of the first principal surface side connection terminal;

a terminal forming process that partly etches, after the buildup process, the coating metal foil to thereby form an upper terminal part of the first principal surface side connection terminal; and, a base removing process that removes the base after the opening forming process and the terminal forming process.

10. The method of manufacturing the multilayer wiring substrate according to claim 9, wherein the opening forming process to form the opening is performed after the terminal forming process partly etches the coating metal foil to thereby form the upper terminal part of the first principal surface side connection terminal.

11. The method of manufacturing the multilayer wiring substrate according to claim 9, wherein the metal foil on the stacked configuration and the resin insulating layer of the uppermost outer layer are processed through laser drilling in the opening forming process.

12. A method of manufacturing a multilayer wiring substrate having: a stacked configuration multilayered by alternately stacking a plurality of resin insulating layers formed with a same material as a main element and a plurality of conductor layers; a plurality of first principal surface side connection terminals arranged on a first principal surface of the stacked configuration; a plurality of a second principal surface side connection terminals arranged on a second principal surface of the stacked configuration; and the plurality of conductor layers arranged in the plurality of resin insulating layers, and connected by a via conductor that becomes expanded in diameter along a direction of facing the first principal surface; the method comprising:

a base preparing process that prepares a base on which stacking metal foils are stacked in a peelable state;

a buildup process that alternately stacks the plurality of conductor layers and the plurality of resin insulating layers on the stacking metal foils to form the stacked configuration;

an opening forming process that performs, after the buildup process, a laser drilling process on a resin insulating layer of an uppermost outer layer to thereby form a plurality of openings, each opening exposing a conductor layer portion corresponding to a lower terminal part of each of the plurality of first principal surface side connection terminals;

an entire plating process that performs electroless copper plating on the stacked configuration to form an entire plating layer that covers the plurality of openings and the plurality of resin insulating layers;

a terminal forming process that partly etches, after the entire plating process, the entire plating layer formed on the resin insulating layer of the uppermost outer layer to form an upper terminal part of each of the plurality of first principal surface side connection terminals at a region surrounding an upper portion of each opening; and, a base removing process that removes the base after the opening forming process and the terminal forming process.

* * * * *